United States Patent
Bagal et al.

(10) Patent No.: US 12,198,928 B2
(45) Date of Patent: Jan. 14, 2025

(54) CARBON GAP FILL PROCESSES

(71) Applicant: Applied Materials, Inc., Santa Clara, CA (US)

(72) Inventors: Abhijeet S. Bagal, Sunnyvale, CA (US); Qian Fu, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 482 days.

(21) Appl. No.: 17/508,419

(22) Filed: Oct. 22, 2021

(65) Prior Publication Data

US 2023/0129550 A1    Apr. 27, 2023

(51) Int. Cl.
*H01L 21/02* (2006.01)
*H01L 21/311* (2006.01)

(52) U.S. Cl.
CPC .. *H01L 21/02274* (2013.01); *H01L 21/02205* (2013.01); *H01L 21/311* (2013.01)

(58) Field of Classification Search
CPC ......... H01L 21/02274; H01L 21/02205; H01L 21/311; H01L 21/02115; C23C 16/045; C23C 16/26; C23C 16/50
See application file for complete search history.

(56) References Cited

U.S. PATENT DOCUMENTS

| | | | | |
|---|---|---|---|---|
| 6,953,608 B2 * | 10/2005 | Leu | ................... | H01L 21/31629 257/E21.279 |
| 2013/0052808 A1 | 2/2013 | Takaba | | |
| 2019/0385907 A1 * | 12/2019 | Gottheim | ............ | H01L 21/6831 |
| 2019/0393030 A1 | 12/2019 | Jiang et al. | | |
| 2021/0151348 A1 | 5/2021 | Utsuno et al. | | |

FOREIGN PATENT DOCUMENTS

| KR | 101353258 B1 | 1/2014 |
|---|---|---|
| WO | 2021-067092 A1 | 4/2021 |
| WO | 2021-162871 A1 | 8/2021 |

OTHER PUBLICATIONS

Application No. PCT/US2022/046170, International Search Report and Written Opinion, Mailed On Feb. 3, 2023, 10 pages.

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary semiconductor processing methods may include providing a carbon-containing precursor to a processing region of a semiconductor processing chamber. A substrate may be disposed within the processing region. The substrate may define one or more recessed features. The methods may include providing a second precursor to the processing region. The methods may include forming a plasma of the carbon-containing precursor and the second precursor in the processing region. Forming the plasma of the carbon-containing precursor and the second precursor may be performed at a plasma power of greater than or about 500 W. The methods may include depositing a carbon-containing material on the substrate. The carbon-containing material may extend within the one or more recessed features. The methods may include, subsequent depositing the carbon-containing material for a first period of time, applying a bias power while depositing the carbon-containing material for a second period of time.

20 Claims, 4 Drawing Sheets

CARBON GAP FILL PROCESSES

TECHNICAL FIELD

The present technology relates to semiconductor systems, processes, and equipment. More specifically, the present technology relates to processes and systems to fill gaps with carbon-containing material.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in recessed features in the materials that may need to be filled with material without leaving seams or voids to avoid unwanted undesirable effects in further processing. Developing materials that can avoid the formation of seams or voids may become more difficult.

Thus, there is a need for improved systems and methods that can be used to produce high quality devices and structures. These and other needs are addressed by the present technology.

SUMMARY

Exemplary semiconductor processing methods may include providing a carbon-containing precursor to a processing region of a semiconductor processing chamber. A substrate may be disposed within the processing region of the semiconductor processing chamber. The substrate may define one or more recessed features along the substrate. The methods may include providing a second precursor to the processing region of the semiconductor processing chamber. The methods may include forming a plasma of the carbon-containing precursor and the second precursor in the processing region. Forming the plasma of the carbon-containing precursor and the second precursor may be performed at a plasma power of greater than or about 500 W. The methods may include depositing a carbon-containing material on the substrate. The carbon-containing material may extend within the one or more recessed features along the substrate. The methods may include, subsequent to depositing the carbon-containing material on the substrate for a first period of time, applying a bias power while depositing the carbon-containing material on the substrate for a second period of time. The carbon-containing material may be deposited on the substrate in situ within the same chamber that etching and/or treatment operations may be performed. This may reduce queue times, and limit exposure of the substrate between operations.

In some embodiments, the carbon-containing precursor may be or include methane ($CH_4$). The one or more recessed features may be characterized by an aspect ratio greater than or about 1:3. A temperature within the semiconductor processing chamber may be maintained at less than or about 100° C. while depositing the carbon-containing material on the substrate. A pressure within the semiconductor processing chamber may be maintained at less than or about 10 mTorr while depositing the carbon-containing material on the substrate. The second precursor may be or include helium, a nitrogen-containing precursor, or argon. The methods may include reducing a flow rate of the carbon-containing precursor between the first period of time and the second period of time. The methods may include increasing a flow rate of the second precursor between the first period of time and the second period of time. A flow rate of the carbon-containing precursor may be greater than or about 10 sccm during the first period of time. A flow rate of the second precursor may be greater than or about 300 sccm during the first period of time. The methods may include, subsequent to depositing the carbon-containing material for the second period of time, increasing the bias power to the processing region of the semiconductor processing chamber while depositing the carbon-containing material on the substrate for a third period of time. The carbon-containing material deposited on the substrate may be substantially free of any seams or voids within the one or more recessed features along the substrate.

Some embodiments of the present technology may encompass semiconductor processing methods. The methods may include providing a carbon-containing precursor to a processing region of a semiconductor processing chamber. A substrate may be disposed within the processing region of the semiconductor processing chamber. The substrate may define one or more recessed features along the substrate. The methods may include forming a plasma of the carbon-containing precursor in the processing region. The methods may include depositing a carbon-containing material on the substrate. The methods may include treating the carbon-containing material with a second precursor. The second precursor may extend the carbon-containing material within the one or more recessed features along the substrate. The methods may include introducing a bias power while depositing the carbon-containing material and treating the carbon-containing material with the second precursor. The bias power may be gradually applied. An initial bias power may be 0 W.

In some embodiments, a temperature within the semiconductor processing chamber may be maintained at less than or about 75° C. while depositing the carbon-containing material and treating the carbon-containing material on the substrate with the second precursor. A pressure within the semiconductor processing chamber may be maintained at greater than or about 7 mTorr while depositing the carbon-containing material and treating the carbon-containing material on the substrate with the second precursor. Subsequent depositing the carbon-containing material on the substrate for a first period of time, the bias power may be introduced such that the bias power is greater than or about 50 W during a second period of time. The second precursor may be or include helium.

Some embodiments of the present technology may encompass semiconductor processing methods. The methods may include etching one or more recessed features along a substrate. The substrate may be disposed within a processing region of a semiconductor processing chamber. The methods may include providing a carbon-containing precursor to a processing region of a semiconductor processing chamber. The methods may include providing a second precursor to the processing region of the semiconductor processing chamber. The methods may include forming a plasma of the carbon-containing precursor and the second precursor in the processing region. The plasma may be characterized by an electron temperature of greater than or about 6 eV. The methods may include depositing a carbon-containing material on the substrate. The carbon-containing material may extend within the one or more recessed features along the substrate. The carbon-containing material may be deposited in the same semiconductor processing chamber as the etching. The methods may include, subsequent to depositing the carbon-containing material on the substrate for a first period of time, applying a bias power to the processing region of the semiconductor processing chamber.

In some embodiments, the bias power applied subsequent the first period of time may be greater than or about 75 W. The second precursor may be or include helium. The methods may include, subsequent to depositing the carbon-containing material for the first period of time, reducing a flow rate of the carbon-containing precursor to the semiconductor processing chamber. A flow rate of the second precursor may be maintained at a flow rate ratio relative to the carbon-containing precursor of greater than or about 10:1 during the first period of time.

Such technology may provide numerous benefits over conventional methods and techniques. For example, the processes may deposit carbon-containing material uniformly in recessed features. Additionally, the processes may reduce or limit seams or voids in the deposited carbon-containing material deposited within the recessed features. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
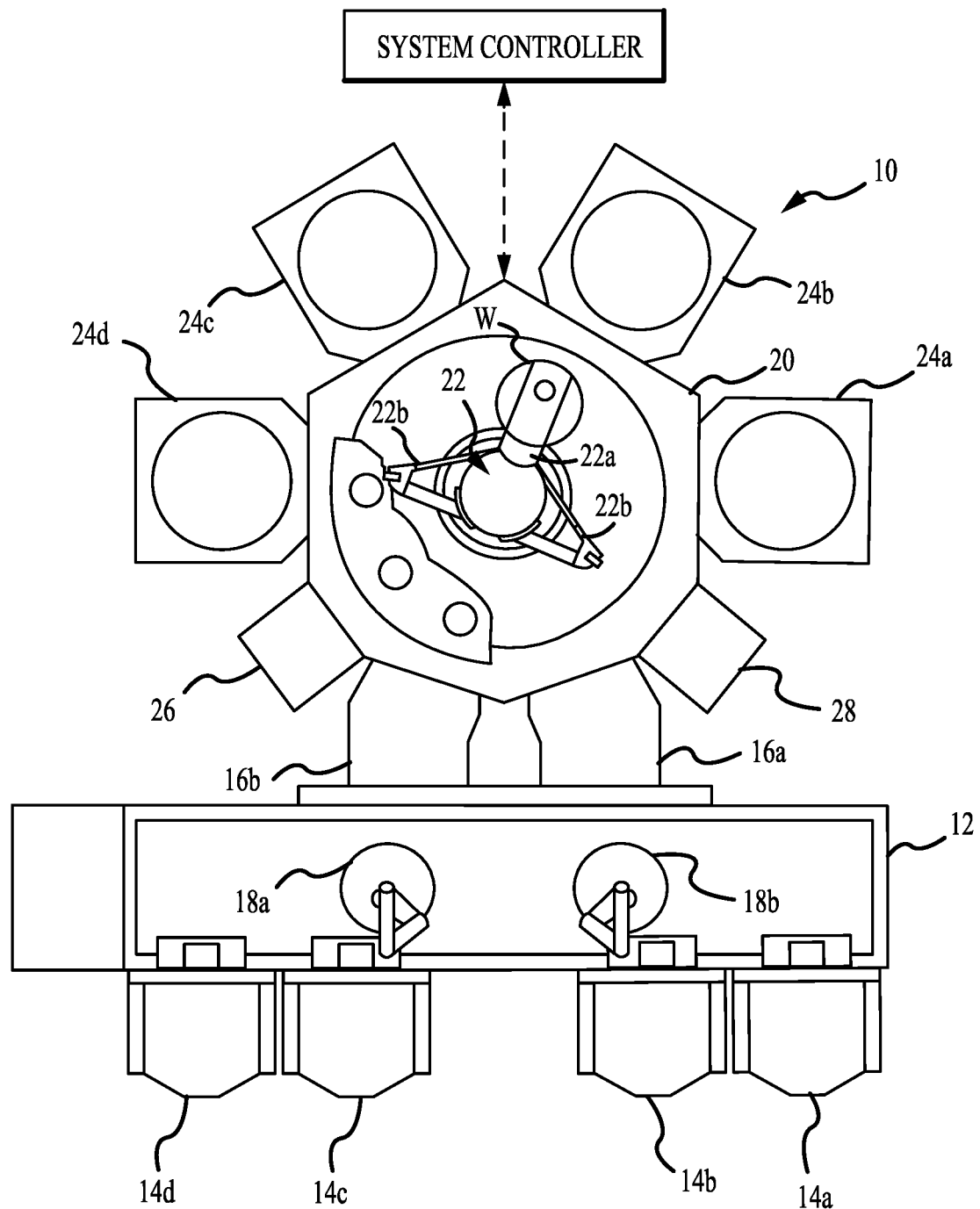
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features inside semiconductor structures may be reduced in size, and aspect ratios of the features may increase. As the aspect ratios of the features increase, subsequent depositions may struggle to fill the high aspect ratio feature without leaving a seam or void.

Conventional technologies have struggled to backfill recessed features on substrates, or materials deposited thereon. Deposition of materials on the underlying structures containing the recessed features may be incomplete. The conformal fill operation may allow the feature to seal near the top of the feature prior to fill within the feature, as well as to produce a seam up the middle of the feature or a void underneath the sealed top. Furthermore, conventional technologies may require performing an etching process in one chamber, breaking vacuum and transferring the structure, and performing the deposition process in a separate chamber. This transfer may allow for undesirable contamination during processing. In some production, where a polishing operation may subsequently occur, the removal of material may cause the seam or void to be exposed, which may provide access within the recessed feature. This may allow oxidation of the material once exposed to atmosphere, as well as incorporation of slurry or other materials along the seam. Accordingly, many conventional technologies have been limited in the ability to prevent structural flaws in the final devices.

The present technology overcomes these issues by providing a carbon-containing precursor as well as a second precursor to backfill the recessed features. The deposition may be performed in the same chamber as the etch process, which may limit queue times and improve structural integrity. By providing the second precursor, the present technology may deposit carbon-containing material toward the bottom of the recessed features without sealing or closing off the recessed feature. By depositing material at the bottom of the feature, any seam or void may be reduced or avoided prior to depositing material such that the feature is sealed or closed off. By filling the features or high aspect ratio structures, the present technology may prevent problems in any following integration processes and/or defects in the final devices.

Although the remaining disclosure will routinely identify specific etching and depositing processes utilizing the disclosed technology, it will be readily understood that the systems and methods are equally applicable to a variety of other processes as may occur in the described chambers. Accordingly, the technology should not be considered to be so limited as for use with the described etching or depositing processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22.

The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
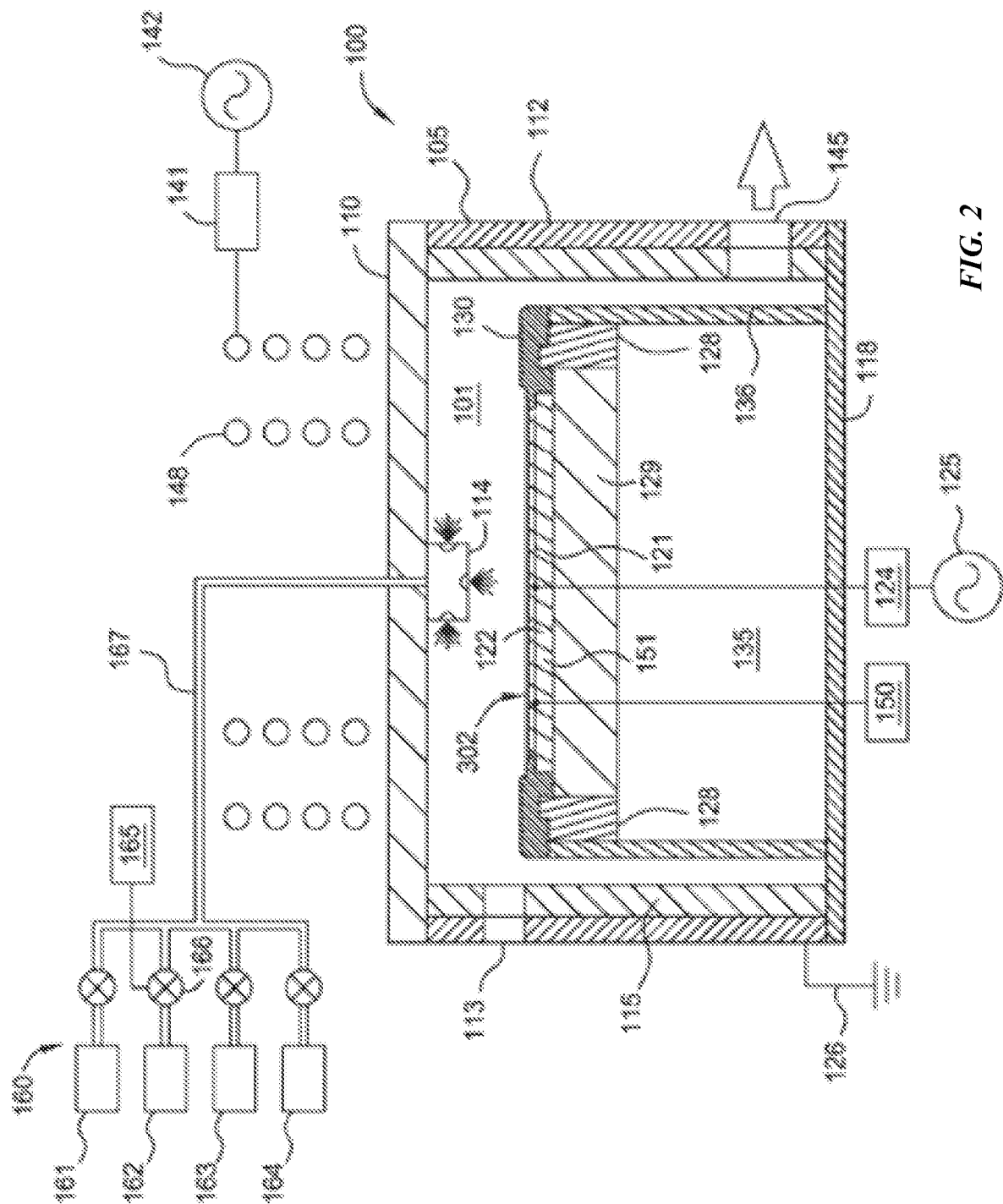
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about $-150°$ C. or lower to about $500°$ C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about $-150°$ C. and about $500°$ C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
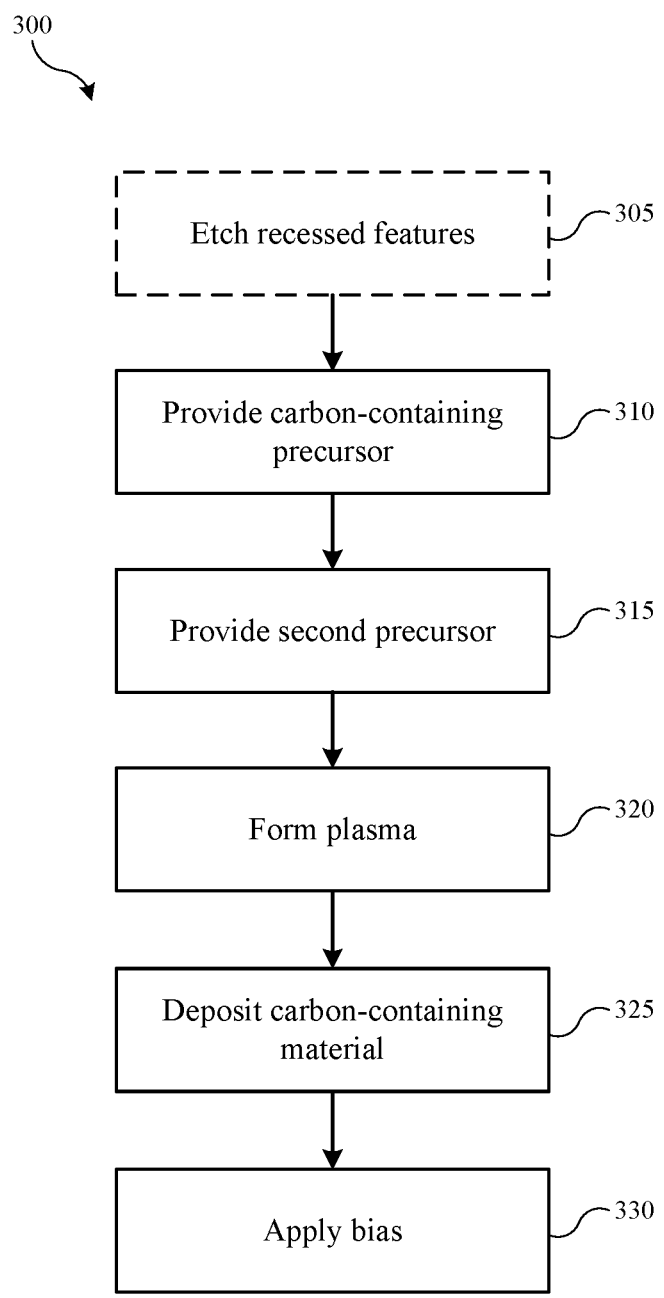
FIG. 3 shows selected operations in a semiconductor processing method according to some embodiments of the present technology.

The processing chambers described above may be used during methods according to embodiments of the present technology. FIG. 3 illustrates a method 300 of semiconductor processing, operations of which may be performed, for example, in one or more chambers 100 incorporated on multi-chamber processing system 10 as previously described. Any other chamber may also be utilized, which may perform one or more operations of any method or process described. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may include a number of operations that may be performed in a number of variations, such as including beginning at different operations of processing. Method 300 may generally include a deposition operation that may occur in chambers in which etch processes may be performed. Often, the deposition may be performed subsequent the etching. Accordingly, although method 300 will be described in a particular order, it is to be understood that the method may be performed in a number of different variations according to embodiments of the present technology. Method 300 may describe operations shown schematically in FIGS. 4A-4D, the illustrations of which will be described in conjunction with the operations of method 300. It is to be understood that structure 400 in FIGS. 4A-4D illustrates only partial schematic views, and a substrate 405 may contain any number of structural sections having aspects as illustrated in the figures, as well as alternative structural aspects that may still benefit from operations of the present technology.

Figure 4A:
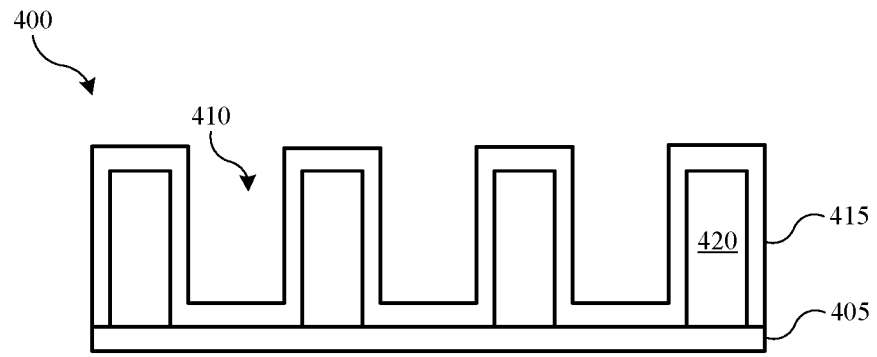
FIGS. 4A-4D show exemplary schematic cross-sectional structures in which material layers are included and produced according to some embodiments of the present technology.
Figure 4B:
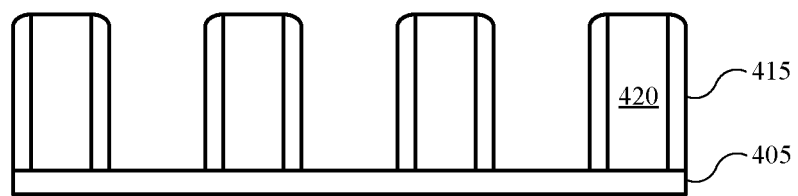

Referring to FIGS. 4A-4B, at optional operation 305, the method may include etching a liner from one or more features along a substrate 405. Substrate 405 may be disposed within the processing region of the semiconductor processing chamber. Substrate 405 may have a substantially planar surface or an uneven surface in embodiments. The substrate 405 may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 405 may have various dimensions, such as 200 mm or 300 mm diameter wafers, as well as rectangular or square panels. As shown in FIG. 4B, etching about one or more features 410 along a substrate 405 may selectively remove material from the substrate 405 or from a material previously deposited on the substrate 405. The substrate 405 may include a liner material 415 and a mandrel material 420 formed over the substrate 405. The liner material 415 may be formed conformally about the mandrel material 420 and any exposed portions of the substrate 405 between the mandrels. Operation 305 may include etching a portion of the liner material 415 and/or mandrel material 420 to recess the liner from lateral surfaces exposed in a directional etch to produce a structure having gaps, such as features 410, between mandrels 420, which may expose portions of substrate 305 between the mandrels. Any variety of etching process may be utilized to form the one or more recessed features 410 along a substrate 405, and may include a directional etch to remove liner material across an upper surface of the mandrels and lateral sections of the substrate between the mandrels, while maintaining the liner 415 along sidewalls of the mandrel material.

The one or more features 410 may be characterized by an aspect ratio, or the feature height to width, greater than or about 1:3. For example, the embodiments of the present disclosure may be suitable to gap fill features characterized by an aspect ratio greater than or about 1:2, greater than or about 1:1, greater than or about 2:1, greater than or about 3:1, greater than or about 4:1, greater than or about 5:1, or more. The height of the recessed features 410 may be greater than or about 30 nm, greater than or about 40 nm, greater than or about 50 nm, or more. As aspect ratios increase, it may be more difficult to fill recesses or gaps as the material being deposited may deposit on upper portions of the recesses such that the recess may close or seal off with a seam or void remaining within the recess. As further described below, embodiments of the present disclosure may deposit carbon-containing material toward the lower portions of the recesses before the recesses are closed or sealed off at the upper portions. That is, embodiments of the present disclosure may fill the recesses or gaps without leaving seams or voids in the recesses or gaps.

At operation 310, the method 200 may include providing a carbon-containing precursor to the processing region of the semiconductor processing chamber 100. Carbon-containing precursors that may be used in operation 310 may be or include any number of carbon-containing precursors. For example, the carbon-containing precursor may be or include any hydrocarbon, or any material including or consisting of carbon and hydrogen. The precursor may include carbon-and-hydrogen-containing precursors, which may include any amount of carbon and hydrogen bonding, along with any other element bonding. In embodiments, the carbon-containing precursor may be or include methane ($CH_4$).

A flow rate of the carbon-containing precursor may be greater than or about 10 sccm, and may be greater than or about 20 sccm, greater than or about 30 sccm, greater than or about 40 sccm, greater than or about 50 sccm, greater than or about 60 sccm, greater than or about 70 sccm, or higher. The flow rate of the carbon-containing precursor may be tailored depending on the rate of the growth desired. Further, the flow rate of the carbon-containing precursor may be tailored depending on the aspect ratios of the recessed features 410. For example, for a high rate of growth or a low aspect ratio feature, the flow rate of the carbon-containing precursor may be increased to a higher value. A higher flow rate of the carbon-containing precursor may reduce the mean free path of the resultant plasma constituents, discussed below, and result in scattering that prevents the carbon-containing material from reaching the bottom of the recessed features 410, or increases deposition on sides and upper surfaces of the structures. Accordingly, in some embodiments the flow rate of the carbon-containing precursor may be maintained at less than or about 100 sccm, and may be maintained at less than or about 90 sccm, less than or about 80 sccm, less than or about 70 sccm, less than or about 60 sccm, less than or about 50 sccm, or less.

At operation 315, the method 200 may include providing a second precursor to the processing region of the semiconductor processing chamber 100, which may occur simultaneously with delivery of the carbon-containing precursor. The second precursor may be or include helium, a nitrogen-containing precursor, or argon. The second precursor may assist in forming carbon-containing material on the bottom of the recessed features 410 for a number of reasons, as will be further described below. A flow rate of the second precursor may be greater than or about 300 sccm. An increased flow rate of the second precursor may assist in depositing the carbon-containing material at the bottom of the recessed features 410. This may be due to an increased plasma temperature or an increased momentum driving the carbon-containing material in the recessed features 410. Accordingly, the flow rate of the second precursor may be greater than or about 350 sccm, greater than or about 400 sccm, greater than or about 450 sccm, greater than or about 500 sccm, greater than or about 600 sccm, greater than or about 700 sccm, or higher.

The flow rates of the carbon-containing precursor and the second precursor may be related, and may be adjusted over time, as will be described further below. For example, the flow rate of the second precursor may be maintained at a flow rate ratio relative to the carbon-containing precursor of greater than or about 10:1 while depositing the carbon-containing material. For example, the flow rate of the second precursor may be maintained at a flow rate ratio relative to the carbon-containing precursor of greater than or about 15:1, greater than or about 20:1, greater than or about 25:1, greater than or about 30:1, greater than or about 35:1, greater than or about 40:1, or more. Providing a greater amount of the second precursor may aid in depositing the carbon-containing material at the bottom of the recessed features 410 without depositing as much of the carbon-containing material at the top of the recessed features 410 such that the recessed features 410 seal or close off with seams or voids remaining.

At operation 320, the method 200 may include forming a plasma. The plasma may be formed from the carbon-containing precursor and/or the second precursor in the processing region of the semiconductor processing chamber 100. Forming the plasma may be performed at a plasma power of greater than or about 500 W. Plasma powers greater than or about 500 W may increase the electron temperature in the plasma. Higher electron temperatures may assist in depositing the carbon-containing material in the recessed features 410. Accordingly, forming the plasma may be performed at a plasma power of greater than or about 600 W, greater than or about 700 W, greater than or about 800 W, greater than or about 900 W, greater than or about 1,000 W, greater than or about 1,250 W, greater than or about 1,500 W, greater than or about 1,750 W, greater than or about 2,000 W, or higher. The plasma may be characterized by an electron temperature of greater than or about 6 eV.

In addition to an increased overall plasma temperature resulting from an increased electron temperature, the increased electron temperature may form high energy ions in the plasma. High energy ions may be able to travel deeper into the recessed features 410, which may assist in depositing carbon-containing material in the recessed features 410. At high source power and electron temperature, excited carbon-containing ions in the plasma may overcome electrostatic or Van der Waal's forces exerted along upper surfaces of the recessed features 410 and travel deeper in the recessed features 410 such that the material may be deposited on the bottom of the recessed features 410.

Figure 4C:
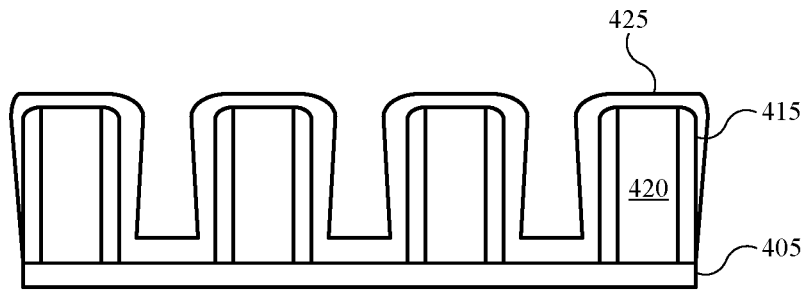
Figure 4D:
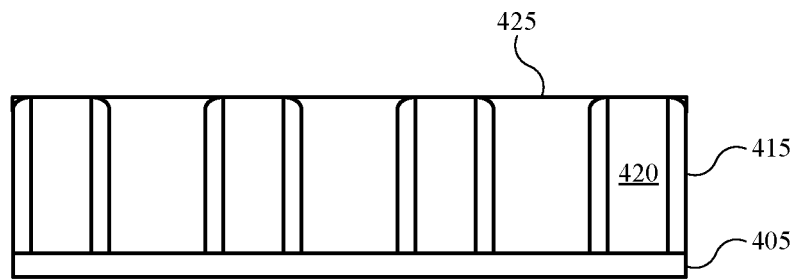

As shown in FIGS. 4C-4D, at operation 325, the method 200 may include depositing a carbon-containing material 425 on the substrate 405. The carbon-containing material 425 may extend within the one or more recessed features 410 along the substrate 405. Carbon deposition may more readily occur on colder surfaces across a substrate, and utilizing plasma and material temperatures and characteristics according to embodiments of the present technology may improve bottom-up filling within the features. Based on the second precursor used, the temperature at the bottom of the recessed features 410 may be maintained colder than the temperature at the top of the recessed features 410. That is, the top of the recessed feature may be affected by the temperature of the plasma, such as the electron temperature in the plasma, whereas the bottom of the recessed feature may be affected by the temperature of the electrostatic chuck. For example, when the second precursor is helium, the electron temperature in the plasma formed at operation 320 may increase compared to other second precursors. Because helium only has two electrons in a single orbital, to form a plasma requires greater energy than compared to argon, for example, which has eighteen electrons in more than one orbital. The electron being removed from helium is much closer to the nucleus than the electron being removed from argon, again for example, and thus requires greater energy to remove. This increase in electron temperature may also increase the overall temperature of the plasma. Consequently, while utilizing argon or nitrogen as a carrier gas may limit electron temperatures of the plasma to less than or about 5 eV, less than or about 4 eV, or less, forming a plasma with increased helium addition may increase the electron temperature to greater than or about 6 eV, greater than or about 8 eV, greater than or about 10 eV, or more.

When the temperature of the plasma, which is above the substrate 405 increases, upper surfaces of the structures across the substrate may be characterized by higher temperatures than recessed features 410, or locations further from plasma exposure. This temperature differential between upper surfaces, such as across the top of mandrels, and lower surfaces between the mandrels, or across exposed regions of the substrate, may improve bottom coverage and fill, while limiting or slowing formation on upper surfaces. Thus, as the material fills fully from the bottom up, the carbon-containing material 425 deposited on the substrate 405 may be free or substantially free of any seams or voids within the one or more recessed features 410 along the substrate 405. By "substantially free," less than 50% of the recessed features 410 may include a seam or void after the carbon-containing material 425 is deposited on the substrate 405.

As previously discussed, helium may increase electron temperature in the plasma and, therefore, the overall temperature in the plasma, which may result in the carbon-containing material 425 forming at the bottom of the recessed feature at a faster rate than at the top of the recessed feature. However, when the second precursor is a nitrogen-containing precursor or argon, the carbon-containing material 425 may still be deposited such that the carbon-containing material 425 deposited on the substrate 405 may be free or substantially free of any seams or voids within the one or more recessed features 410 along the substrate 405. For example, with a nitrogen-containing precursor or argon, the carbon-containing material 425 may be driven downward into the recessed features 410 due to the greater momentum of the larger ions of the plasma. That is, nitrogen-containing precursors and argon may have higher atomic weights than helium and, due to the momentum and mean free path of the ions, may force the carbon-containing material 425 down within the recessed features 410. Consequently, in some embodiments an amount of nitrogen and/or argon may be used during the deposition. Additionally, in some embodiments the deposition precursors may be free of nitrogen or argon, and carrier gases for the carbon-containing precursor may only include helium for the reasons described above.

During operation 325, a temperature within the semiconductor processing chamber 100 such as a substrate support temperature, or a substrate temperature, may be maintained at less than or about 100° C. while depositing the carbon-containing material 425 on the substrate 405. As described previously, lower temperatures toward the bottom of the substrate 405 may aid in depositing the carbon-containing material 425 at the bottom of the recessed features 410 without sealing or closing the recessed features 410 prior to filling with carbon-containing material 425. Accordingly, the temperature within the semiconductor processing chamber 100 may be maintained at less than or about 90° C., less than or about 80° C., less than or about 70° C., less than or about 60° C., less than or about 50° C., less than or about 40° C., less than or about 30° C., less than or about 20° C., less than or about 10° C., or lower.

Further, a pressure within the semiconductor processing chamber 100 may be maintained at less than or about 10 mTorr while depositing the carbon-containing material 425 on the substrate 405. With lower pressures, such as less than or about 10 mTorr, the mean free path of the ions in the plasma may be longer. Similarly, lower pressures may allow for greater ion energy in the plasma. With a longer mean free path, the carbon-containing material 425 may be able to reach the bottom portions of the recessed features 410 without first accumulating at the tops of the recessed features 410 and sealing off or closing the recessed features 410. With higher pressures, the mean free path may reduce and scattering may increase, which may result in the carbon-containing material 425 being deposited on the top instead of the bottom of the recessed features 410. Accordingly, the pressure within the semiconductor processing chamber 100 may be maintained at less than or about 9 mTorr, less than or about 8 mTorr, less than or about 7 mTorr, less than or about 6 mTorr, less than or about 5 mTorr, less than or about 4 mTorr, less than or about 3 mTorr, less than or about 2 mTorr, or lower.

At operation 330, the method 200 may include, subsequent to depositing the carbon-containing material 425 on the substrate 405 for a first period of time, applying a bias power while continuing to deposit the carbon-containing material 425 on the substrate 405 for a second period of time. Furthermore, at operation 330, the method 200 may include reducing a flow rate of the carbon-containing precursor between the first period of time and the second period of time, and may additionally include increasing a flow rate of the second precursor between the first period of time and the second period of time at operation 330.

Initially, while depositing the carbon-containing material 425 on the substrate 405, no bias power may be applied to the plasma, and the deposition may occur directly from source power delivery. By beginning the method 200 without bias, the carbon-containing material 425 may be deposited as a conformal protective layer on the one or more recessed features 410 such that the eventual application of bias will not damage the remaining liner material across the mandrel material 420 or the one or more recessed features 410. The bias power applied subsequent the first period of time may be greater than or about 75 W. By applying bias power, the one or more recessed features 410 may be more uniformly filled with the carbon-containing material 425, while controlling or limiting further deposition along the top of the features. By applying bias, the carbon-containing material 425 may be deposited further in one or more recessed features 410. Without bias, the carbon-containing material 425 may tend to deposit on the upper portions of the one or more recessed features 410. The bias may increase directional delivery and facilitate driving the deposition of the carbon-containing material 425 on the bottom of the one or more recessed features 410. By increasing the rate of deposition at the bottom portions of the one or more recessed features 410, the one or more recessed features 410 may be filled with carbon-containing material 425 prior to the upper portions of the one or more recessed features 410 closing or sealing off, leaving a seam or void in the features. Accordingly, the bias may be greater than or about 100 W, greater than or about 150 W, greater than or about 200 W, greater than or about 250 W, greater than or about 300 W, or higher. However, if the applied bias is too high, the one or more recessed features 410 may be damaged. For example, if the bias is too high, such as greater than 400 W, the mandrel material 420 and/or liner material 415 may chip, crack, or crumble. Thus, the bias may be less than or about 400 W, less than or about 350 W, less than or about 325 W, less than or about 300 W, less than or about 250 W, or less.

Subsequent depositing the carbon-containing material 425 for the second period of time, the method 200 may include increasing the bias power while continuing to deposit the carbon-containing material 425 on the substrate 405 for a third period of time. After beginning to deposit the carbon-containing material 425, the bias may be increased. At the third period of time, the bias may be increased to levels greater than or about 400 W as the deposited carbon-containing material 425 may serve to protect the mandrel material 420 and/or liner material 415 from damage resulting from the increased bias power.

Depending on the structures being filled, any number of additional operations may be performed. For example, in embodiments of the present technology, multi-step deposition may be performed in which a first deposition may be performed without bias power, followed by any number of additional deposition operations with increasing bias power. As noted above, the first operation may include a higher flow-rate ratio of the carbon-containing precursor to the second precursor, which may increase carbon deposition more conformally across the features. Accordingly, the first deposition without bias may be performed for a reduced time relative to subsequent deposition operations, which may limit the amount of coverage formed across the upper surfaces of the features. In some embodiments, the first deposition operation may be performed for less than or about 60 seconds, and may be performed for less than or about 50 seconds, less than or about 40 seconds, less than or about 30 seconds, or less. Additionally, a flow rate ratio of the second precursor to the carbon-containing precursor may be greater than or about 20:1, and may be less than or about 18:1, less than or about 16:1, less than or about 14:1, or less.

After the first period of time, bias may be applied as discussed above, and the flow rate ratio of the second precursor to the carbon-containing precursor may be increased to greater than or about 15:1, greater than or about 20:1, greater than or about 25:1, or greater. The flow-rate ratio may be adjusted by increasing the second precursor flow, decreasing the carbon-containing precursor flow, or both. This may allow a more anisotropic fill to occur within the feature, as well as an amount of trimming at upper surfaces of the features. In some embodiments, the second deposition operation may occur for any of the times noted above, and may occur for a longer or shorter period of time than the first deposition operation. These adjustments may continue any number of additional times to further increase the flow-rate ratio, which may continue to allow bottom-up deposition through the features. For example, after a second period of time, a further adjustment to the bias power may or may not occur, and a flow rate ratio may be further increased between the second precursor and the carbon-containing precursor to greater than or about 20:1, greater than or about 25:1, greater than or about 30:1, greater than or about 40:1, or greater. Again, the flow-rate ratio may be adjusted by increasing the second precursor flow, decreasing the carbon-containing precursor flow, or both. Because of the reduced amount of carbon relative to the second precursor, and depending on the size or aspect ratio of the features being filled, the third or subsequent time period may be greater than the first time period, and may be greater than or about 60 seconds, greater than or about 80 seconds, greater than or about 100 seconds, greater than or about 150 seconds, greater than or about 200 seconds, greater than or about 250 seconds, greater than or about 300 seconds, or more. Further adjustments may continue to be made during this or any subsequent deposition time period. It is contemplated the method 200 may include any number of iterations or steps to form the carbon-containing material 425, and that three steps is purely exemplary. For example, four, five, six, seven, or more steps may be used where bias and flow rates may be modified. By using a multi-step approach, the one or more recessed features 410 may be filled with carbon-containing material 425 without a mushroom or bread loaf shape occurring on the recessed features 410. Further, the carbon-containing material 425 may be free or substantially free of seams or voids.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a carbon-containing precursor" includes a plurality of such precursors, and reference to "the carbon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a carbon-containing precursor to a processing region of a semiconductor processing chamber, wherein a substrate is disposed within the processing region of the semiconductor processing chamber, and wherein the substrate defines one or more recessed features along the substrate;
providing a second precursor to the processing region of the semiconductor processing chamber;
forming a plasma of the carbon-containing precursor and the second precursor in the processing region, wherein forming the plasma of the carbon-containing precursor and the second precursor is performed at a plasma power of greater than or about 500 W;
depositing a carbon-containing material on the substrate, wherein the carbon-containing material extends within the one or more recessed features along the substrate; and
subsequent depositing the carbon-containing material on the substrate for a first period of time, applying a bias power while depositing the carbon-containing material on the substrate for a second period of time.

2. The semiconductor processing method of claim 1, wherein the carbon-containing precursor comprises methane ($CH_4$).

3. The semiconductor processing method of claim 1, wherein the one or more recessed features are characterized by an aspect ratio greater than or about 1:3.

4. The semiconductor processing method of claim 1, wherein a temperature within the semiconductor processing chamber is maintained at less than or about 100° C. while depositing the carbon-containing material on the substrate.

5. The semiconductor processing method of claim 1, wherein a pressure within the semiconductor processing chamber is maintained at less than or about 10 m Torr while depositing the carbon-containing material on the substrate.

6. The semiconductor processing method of claim 1, wherein the second precursor comprises helium, a nitrogen-containing precursor, or argon.

7. The semiconductor processing method of claim 1, further comprising reducing a flow rate of the carbon-containing precursor between the first period of time and the second period of time.

8. The semiconductor processing method of claim 1, further comprising increasing a flow rate of the second precursor between the first period of time and the second period of time.

9. The semiconductor processing method of claim 1, wherein:
a flow rate of the carbon-containing precursor is greater than or about 10 sccm during the first period of time; and
a flow rate of the second precursor is greater than or about 300 sccm during the first period of time.

10. The semiconductor processing method of claim 1, further comprising, subsequent depositing the carbon-containing material for the second period of time, increasing the bias power to the processing region of the semiconductor processing chamber while depositing the carbon-containing material on the substrate for a third period of time.

11. The semiconductor processing method of claim 1, wherein the carbon-containing material deposited on the substrate is substantially free of any seams or voids within the one or more recessed features along the substrate.

12. A semiconductor processing method comprising:
providing a carbon-containing precursor to a processing region of a semiconductor processing chamber, wherein a substrate is disposed within the processing region of the semiconductor processing chamber, and wherein the substrate defines one or more recessed features along the substrate;
forming a plasma of the carbon-containing precursor in the processing region;
depositing a carbon-containing material on the substrate;
treating the carbon-containing material with a second precursor, wherein the second precursor extends the carbon-containing material within the one or more recessed features along the substrate; and
introducing a bias power while depositing the carbon-containing material and treating the carbon-containing material with the second precursor, wherein the bias power is gradually applied, and wherein an initial bias power is 0 W.

13. The semiconductor processing method of claim 12, wherein:
a temperature within the semiconductor processing chamber is maintained at less than or about 75° C. while depositing the carbon-containing material and treating the carbon-containing material on the substrate with the second precursor; and a pressure within the semiconductor processing chamber is maintained at greater than or about 7 mTorr while depositing the carbon-containing material and treating the carbon-containing material on the substrate with the second precursor.

14. The semiconductor processing method of claim 12, wherein subsequent depositing the carbon-containing material on the substrate for a first period of time, the bias power is introduced such that the bias power is greater than or about 50 W during a second period of time.

15. The semiconductor processing method of claim 12, wherein the second precursor comprises helium.

16. A semiconductor processing method comprising:
   etching one or more recessed features along a substrate, wherein the substrate is disposed within a processing region of a semiconductor processing chamber;
   providing a carbon-containing precursor to the processing region of the semiconductor processing chamber;
   providing a second precursor to the processing region of the semiconductor processing chamber;
   forming a plasma of the carbon-containing precursor and the second precursor in the processing region, wherein the plasma is characterized by an electron temperature of greater than or about 6 eV;
   depositing a carbon-containing material on the substrate, wherein the carbon-containing material extends within the one or more recessed features along the substrate, and wherein the carbon-containing material is deposited in the same semiconductor processing chamber as the etching; and
   subsequent depositing the carbon-containing material on the substrate for a first period of time, applying a bias power to the processing region of the semiconductor processing chamber.

17. The semiconductor processing method of claim 16, wherein the bias power applied subsequent the first period of time is greater than or about 75 W.

18. The semiconductor processing method of claim 16, wherein the second precursor comprises helium.

19. The semiconductor processing method of claim 16, further comprising, subsequent depositing the carbon-containing material for the first period of time, reducing a flow rate of the carbon-containing precursor to the semiconductor processing chamber.

20. The semiconductor processing method of claim 16, wherein a flow rate of the second precursor is maintained at a flow rate ratio relative to the carbon-containing precursor of greater than or about 10:1 during the first period of time.

* * * * *